(12) United States Patent
Kim

(10) Patent No.: US 12,532,702 B2
(45) Date of Patent: Jan. 20, 2026

(54) MODULE TRAY FOR SEMICONDUCTOR DEVICE

(71) Applicant: SAMSUNG ELECTRONICS CO., LTD., Suwon-si (KR)

(72) Inventor: Taegeon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/642,727

(22) Filed: Apr. 22, 2024

(65) Prior Publication Data

US 2024/0404856 A1 Dec. 5, 2024

(30) Foreign Application Priority Data

May 30, 2023 (KR) .................. 10-2023-0068944

(51) Int. Cl.
*H01L 21/673* (2006.01)
(52) U.S. Cl.
CPC .............................. *H01L 21/67333* (2013.01)
(58) Field of Classification Search
CPC ........... H01L 21/67333; H01L 21/6734; H01L 21/67346
USPC .................... 206/706, 707, 710–714
See application file for complete search history.

(56) References Cited

U.S. PATENT DOCUMENTS

| | | | | |
|---|---|---|---|---|
| 5,492,223 A | * | 2/1996 | Boardman | H01L 21/67333 206/509 |
| 6,914,771 B2 | * | 7/2005 | Ono | H05K 13/0084 206/725 |
| 8,305,103 B2 | | 11/2012 | Kang et al. | |
| 8,917,519 B2 | * | 12/2014 | Sano | H05K 5/15 206/706 |
| 11,329,340 B2 | | 5/2022 | Kim et al. | |
| 2003/0209465 A1 | * | 11/2003 | Shoji | H01L 23/49861 206/711 |
| 2004/0104139 A1 | * | 6/2004 | Yoshizawa | H01L 21/67346 206/454 |
| 2005/0016898 A1 | * | 1/2005 | Watson | H05K 13/0084 206/713 |

(Continued)

FOREIGN PATENT DOCUMENTS

| | | |
|---|---|---|
| CN | 114013988 A | 2/2022 |
| JP | 2012-0234124 | 11/2012 |

(Continued)

*Primary Examiner* — Rafael A Ortiz
(74) *Attorney, Agent, or Firm* — Morgan, Lewis & Bockius LLP

(57) ABSTRACT

A module tray for a semiconductor device includes a base plate, and first and second sidewalls extending in a vertical direction on the base plate to define an accommodating space in which a semiconductor substrate is accommodated. The first and second sidewalls include first and second support portions and first and second fastening grooves respectively. The first and second support portions have seating surfaces for supporting a lower surface of the semiconductor substrate in the accommodating space. The first and second fastening grooves respectively extend along the seating surfaces and are configured to temporarily fix the semiconductor substrate through predetermined shapes that correspond to both side portions of the semiconductor substrate.

18 Claims, 10 Drawing Sheets

(56) References Cited

U.S. PATENT DOCUMENTS

| | | | | |
|---|---|---|---|---|
| 2011/0018121 | A1* | 1/2011 | Lee | H01L 23/49822 |
| | | | | 257/E23.141 |
| 2013/0032508 | A1* | 2/2013 | Azuma | H01L 21/67333 |
| | | | | 206/710 |
| 2013/0316095 | A1* | 11/2013 | Reber | H01L 21/67346 |
| | | | | 118/503 |
| 2016/0086834 | A1* | 3/2016 | Kim | H01L 21/67333 |
| | | | | 206/710 |

FOREIGN PATENT DOCUMENTS

| | | |
|---|---|---|
| KR | 10-1998-0029937 A | 7/1998 |
| KR | 10-2004-0003909 A | 1/2004 |
| KR | 1026529 B1 | 4/2011 |
| KR | 10-2022-0033096 A | 3/2022 |

\* cited by examiner

MODULE TRAY FOR SEMICONDUCTOR DEVICE

CROSS-REFERENCE TO RELATED APPLICATION

This application claims priority under 35 U.S.C. § 119 to Korean Patent Application No. 10-2023-0068944, filed on May 30, 2023 in the Korean Intellectual Property Office (KIPO), the contents of which are herein incorporated by reference in their entirety.

TECHNICAL FIELD

The present disclosure relates to semiconductor devices and, more specifically, to a module tray for a semiconductor device.

DISCUSSION OF THE RELATED ART

A module tray may be used to store and contain a plurality of semiconductor substrates. For example, the semiconductor substrates may be held within the module tray and moved about during manufacturing. The semiconductor substrates accommodated in the module tray may come off the module tray during automated or manual work. When the semiconductor substrates come off the module tray, the semiconductor substrates may become vulnerable to being damaged. When semiconductor substrates come off the module tray during a semiconductor manufacturing process, the semiconductor manufacturing processes may be interrupted.

SUMMARY

A module tray for a semiconductor device includes a base plate, and first and second sidewalls extending in a vertical direction from the base plate to define an accommodating space in which a semiconductor substrate is accommodated. The first and second sidewalls include first and second support portions and first and second fastening grooves. The first and second support portions have seating surfaces for supporting a lower surface of the semiconductor substrate in the accommodating space. The first and second fastening grooves respectively extend along the seating surfaces and are configured to temporarily fix the semiconductor substrate through predetermined shapes that correspond to both side portions of the semiconductor substrate.

A module tray for a semiconductor device includes a base plate, and first and second sidewalls extending in a vertical direction from the base plate to define an accommodating space in which a semiconductor substrate is accommodated. The first and second sidewalls include first and second support portions having first and second seating surfaces for supporting a lower surface of the semiconductor substrate. First and second fastening grooves respectively extend along the first and second seating surfaces. The first and second fastening grooves respectively have first and second shapes that correspond to first and second side portions of the semiconductor substrate. The first and second fastening grooves are configured to engage to or separate from the first and second side portions of the semiconductor substrate through the first and second shapes.

A module tray for a semiconductor device includes a base plate, first and second sidewalls extending in a vertical direction from the base plate to define an accommodating space in which a semiconductor substrate is accommodated, and third and fourth sidewalls extending in the vertical direction from the base plate between the first and second sidewalls. The first and second sidewalls include first and second support portions having first and second seating surfaces for supporting a lower surface of the semiconductor substrate, and first and second fastening grooves respectively extending along the first and second seating surfaces. The first and second fastening grooves respectively have first and second shapes that correspond to first and second side portions of the semiconductor substrate. The first and second fastening grooves are configured to engage to or separate from the first and second side portions of the semiconductor substrate through the first and second shapes. The third and fourth sidewalls include third and fourth support portions having third and fourth seating surfaces disposed on a same plane as the first and second seating surfaces. Third and fourth fastening grooves respectively extend along the third and fourth seating surfaces. The third and fourth fastening grooves respectively have third and fourth shapes that correspond to third and fourth side portions of the semiconductor substrate. The third and fourth fastening grooves are configured to engage to or separate from the third and fourth side portions of the semiconductor substrate through the third and fourth shapes.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EXAMPLE EMBODIMENTS

Hereinafter, example embodiments of the present disclosure will be explained in detail with reference to the accompanying drawings.

Figure 1:
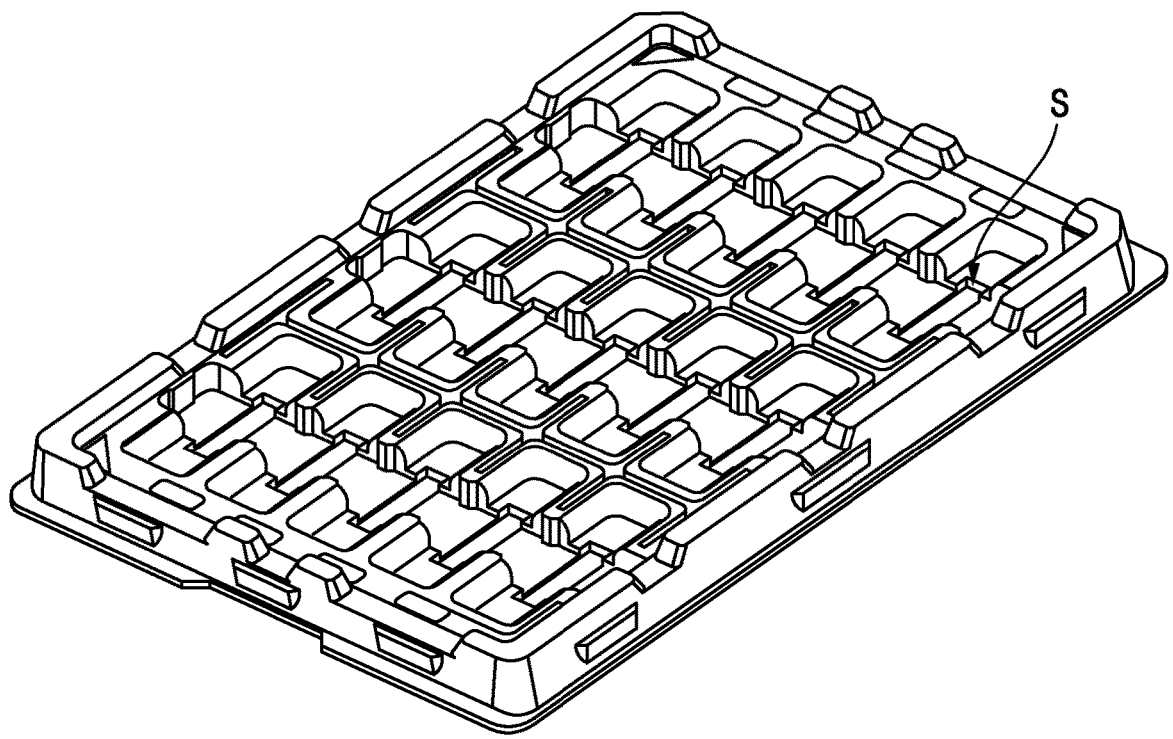
FIG. 1 is a perspective view illustrating a module tray for a semiconductor device in accordance with example embodiments of the present disclosure.
Figure 1:
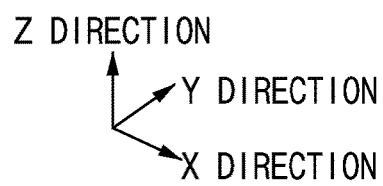
Figure 2:
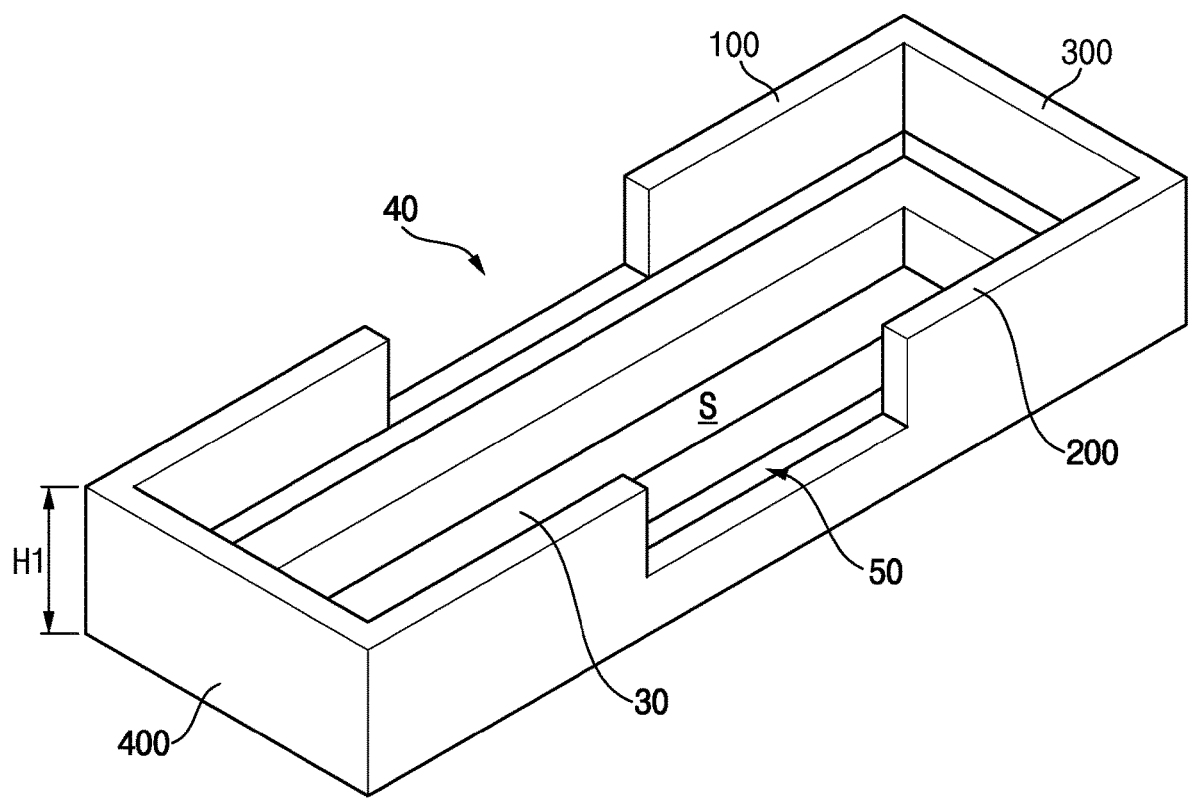
FIG. 2 is a perspective view illustrating first to fourth sidewalls of the module tray in FIG. 1.
Figure 2:
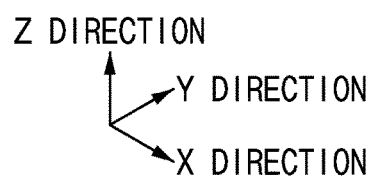
Figure 3:
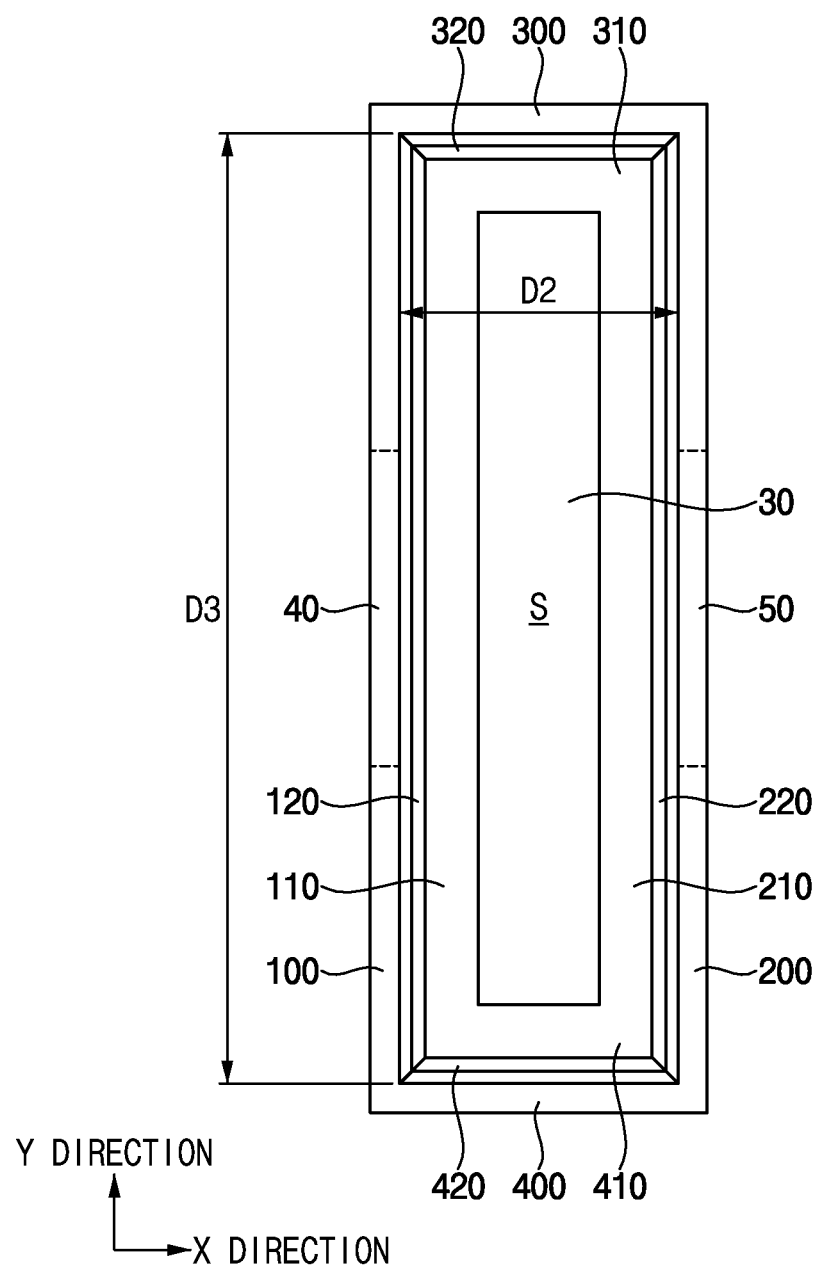
FIG. 3 is a plan view illustrating an accommodating space in FIG. 2.
Figure 4:
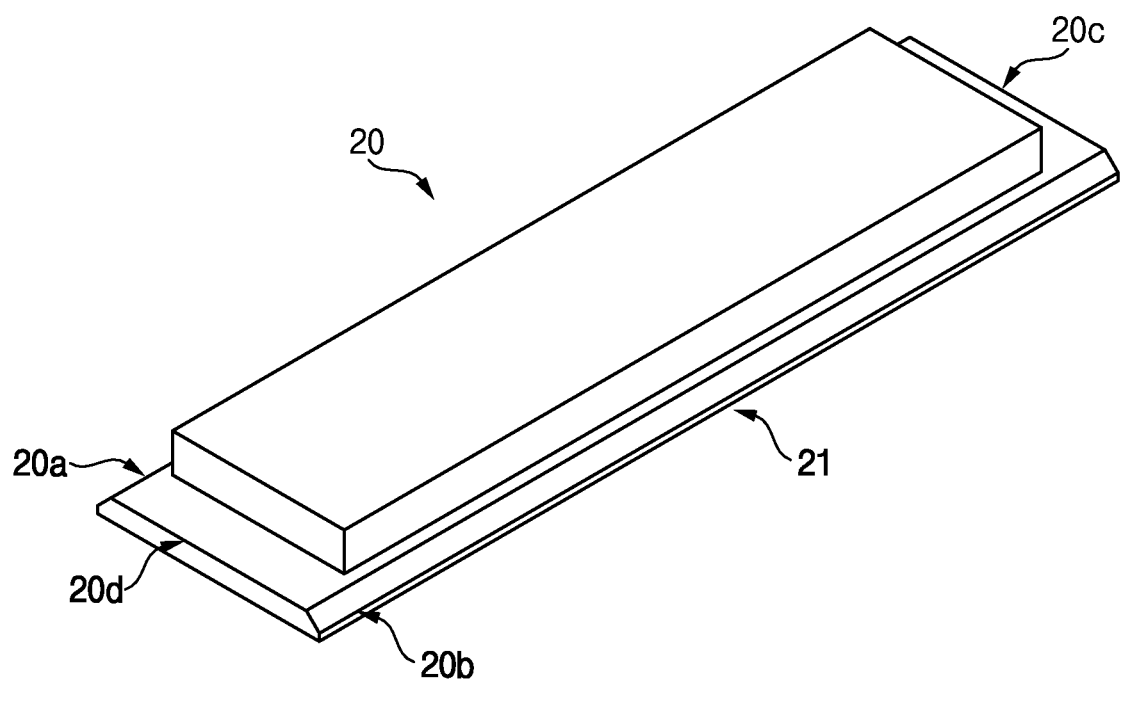
FIG. 4 is a perspective view illustrating a semiconductor substrate to be accommodated in the module tray in accordance with example embodiments of the present disclosure.
Figure 5:
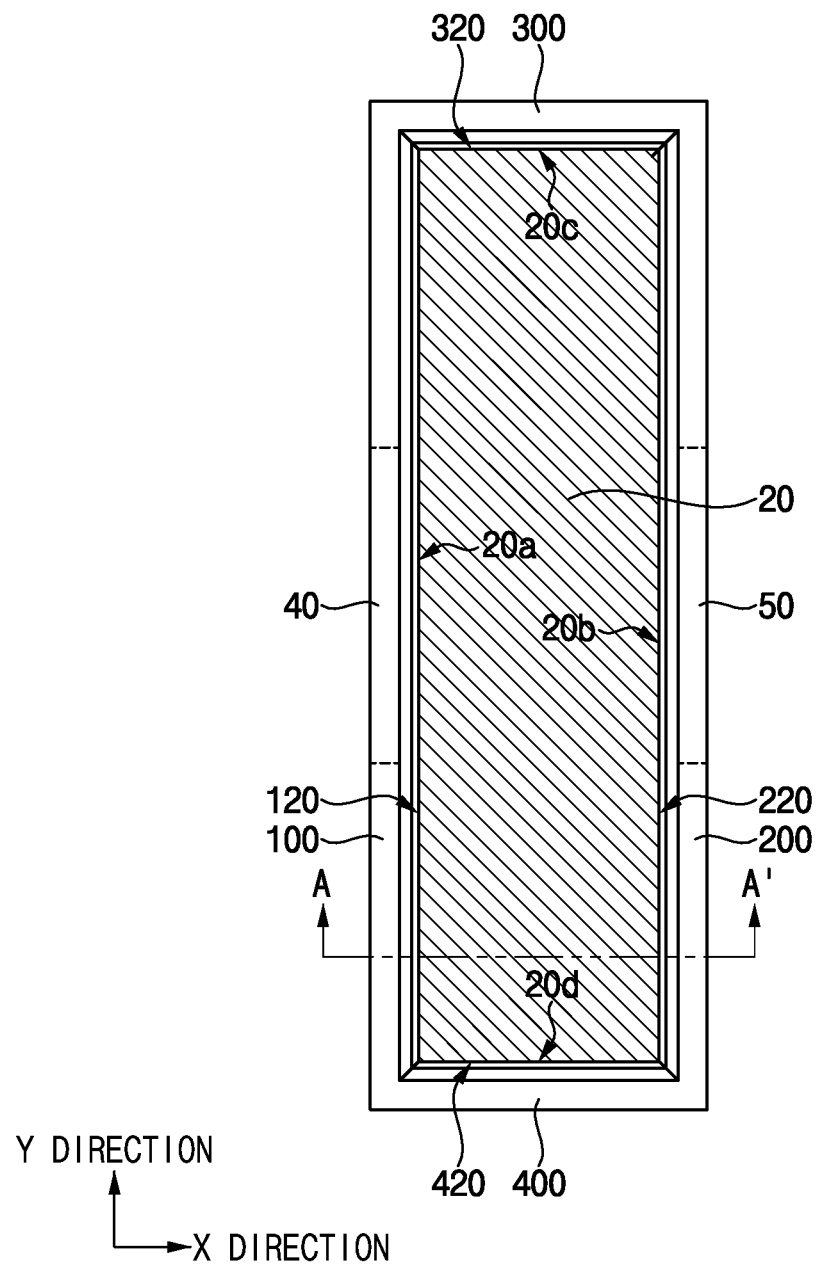
FIG. 5 is a plan view illustrating an accommodating space in which the semiconductor substrate in FIG. 4 is accommodated.
Figure 6:
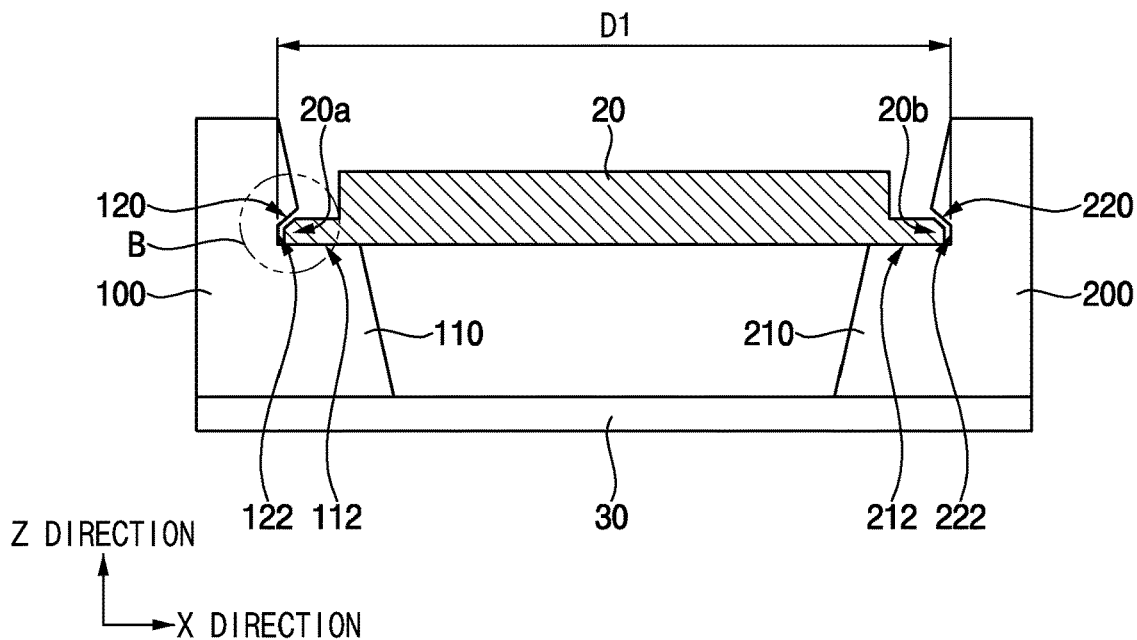
FIG. 6 is a cross-sectional view taken along the line A-A' in FIG. 5.
Figure 7:
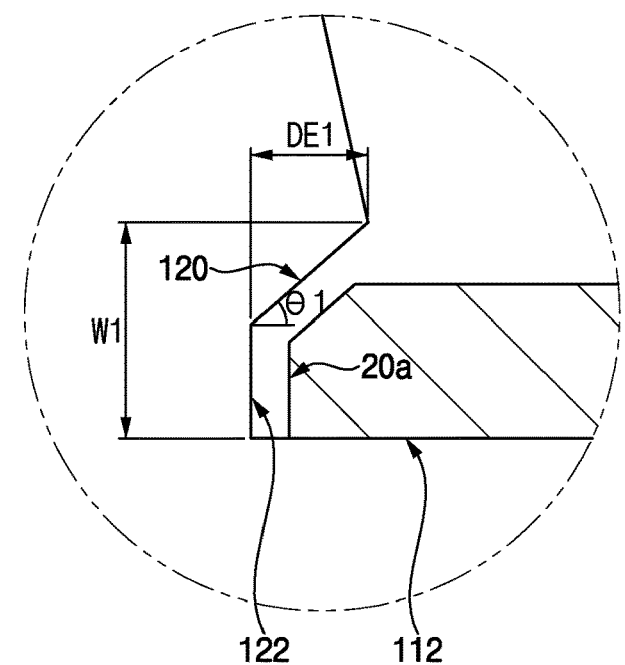
FIG. 7 is an enlarged cross-sectional view illustrating portion 'B' in FIG. 1.

FIG. 1 is a perspective view illustrating a module tray for a semiconductor device in accordance with example embodiments of the present disclosure. FIG. 2 is a perspective view illustrating first to fourth sidewalls of the module tray in FIG. 1. FIG. 3 is a plan view illustrating an accommodating space in FIG. 2. FIG. 4 is a perspective view illustrating a semiconductor substrate to be accommodated in the module tray in accordance with example embodiments of the present disclosure. FIG. 5 is a plan view illustrating an accommodating space in which the semiconductor substrate in FIG. 4 is accommodated. FIG. 6 is a cross-sectional view taken along the line A-A' in FIG. 5. FIG. 7 is an enlarged cross-sectional view illustrating portion 'B' in FIG. 1.

Referring to FIGS. 1 and 2, a module tray 10 for a semiconductor device may have at least one accommodating space S that is configured to accommodate the semiconductor device.

In example embodiments of the present disclosure, the module tray 10 may be a device for stably holding, storing, and transporting the semiconductor devices. The module tray 10 may protect the semiconductor devices from external impact. The module tray 10 may provide a space that is configured to simultaneously accommodate and transport a plurality of the semiconductor devices.

The semiconductor device accommodated in the module tray 10 may include a semiconductor substrate 20. The semiconductor substrate 20 may include a printed circuit board (PCB) and a substrate on which a semiconductor package manufacturing process is performed. The PCB may be a multilayered circuit board having vias and various circuits disposed therein.

The semiconductor substrate 20 may include a Solid-state Storage Drive (SSD). The SSD may be a storage medium including NAND flash memory and a controller controlling the NAND flash memory, and may be a storage device with high read and write speeds and low power consumption. The SSD may include various types such as 2.5" (U.2, U.3), EDSFF, and M.2.

The semiconductor substrate 20 may include Dynamic Random Access Memory (DRAM). For example, the semiconductor substrate 20 may include DDR3, DDR4, DDR5, LPDDR (Low Power Double Data Rate), and the like. The module tray 10 may serve as a carrier that loads a plurality of semiconductor substrates 20 therein for the semiconductor package manufacturing process.

The module tray 10 may include a box body that has a rectangular parallelepiped shape and includes at least an opened portion of an upper surface. The module tray 10 may include a base plate 30. The base plate 30 may lie flat.

For example, the module tray 10 may include a metal material such as stainless steel (SS). Alternatively, the module tray 10 may include a plastic material. For example, the plastic material may include polyethylene (PE), polypropylene (PP), polystyrene (PS), polyethylene terephthalate (PET), polyamides (PA), polyester (PES), polyvinyl chloride (PVC), polyurethanes (PU), polycarbonate (PC), polyvinylidene chloride (PVDC), etc.

The module tray 10 may include the plastic material or the metal material having strong hardness (for example, a material having a hardness of 6 and above on the Mohs scale) and high toughness (for example, a material having a toughness of 100 J and above on the Charpy impact test). When the semiconductor substrate 20 is inserted into the module tray 10, the module tray 10 may protect the semiconductor substrate 20 that is accommodated therein, from the external impact. The module tray 10 may be individually stored and managed in a state that the semiconductor substrate 20 is not accommodated. Since the module tray 10 has a rectangular parallelepiped shape, a plurality of module trays 10 may be stacked on one another to be stored.

The module tray 10 may be formed by a compression molding process. Alternatively, the module tray 10 may be formed by an injection molding process, an extrusion molding process, a transfer molding process, a laminating molding process, a casting process, a thermoforming process, etc. The module tray 10 formed by the compression molding process may have a relatively small thickness. For example, a thickness of the module tray 10 may be within a range of 0.5 mm to 3 mm.

The module tray 10 may include a first sidewall 100 and a second sidewall 200 facing each other, and a third sidewall 300 and a fourth sidewall 400 extending between the first and second sidewalls 100 and 200. The first to fourth sidewalls 100, 200, 300 and 400 may be disposed on the base plate 30.

In this specification, a direction (e.g., X direction) between the first sidewall 100 and the second sidewall 200 may be a first horizontal direction, a direction (e.g., Y direction) between the third sidewall 300 and the fourth sidewall 400 may be a second horizontal direction, and a direction perpendicular to the first horizontal direction and the second horizontal direction may be a vertical direction (e.g., Z direction).

The first to fourth sidewalls 100, 200, 300 and 400 may define an accommodating space S for accommodating the semiconductor substrate 20. When the module tray 10 has a plurality of accommodating spaces S, the module tray 10 may have a plurality of the first to fourth sidewalls 100, 200, 300, and 400 that are disposed on the base plate 30.

The semiconductor substrate 20 may be accommodated in the accommodating space S. A planar area of the semiconductor substrate 20 may be smaller than a planar area between the first to fourth sidewalls 100, 200, 300 and 400. In a plan view, the semiconductor substrate 20 may be accommodated in the accommodating space S within a region between the first to fourth sidewalls 100, 200, 300, and 400.

The semiconductor substrate 20 may be accommodated in the accommodating space S such that a lower surface 21 of the semiconductor substrate 20 faces the base plate 30. In this case, when the semiconductor substrate 20 is accommodated in the accommodating space S, a thickness direction thereof may be the vertical direction (e.g., Z direction). Alternatively, the semiconductor substrate 20 may be accommodated in the accommodating space S such that one of first and second side portions 20a and 20b of the semiconductor substrate 20 faces the base plate 30. In this case, when the semiconductor substrate 20 is accommodated in the accommodating space S, a longitudinal direction thereof may be the vertical direction (e.g., Z direction).

When the module tray 10 has the plurality of first to fourth sidewalls 100, 200, 300, 400 defining the plurality of accommodating spaces S, the accommodating spaces S may be arranged in an array form. One of the accommodating spaces S may accommodate one semiconductor substrate 20. Alternatively, one of the accommodating spaces S may accommodate the plurality of semiconductor substrates 20 to be stacked on each other.

In this embodiment, the module tray 10 is illustrated as having 15 accommodating spaces S formed therein. However, it is not necessarily limited thereto, and for example, the module tray 10 may have 4 to 30 accommodating spaces S arranged therein.

In example embodiments of the present disclosure, the first and second sidewalls 100 and 200 may extend in the vertical direction (e.g., Z direction) on the base plate 30 to define the accommodating space S. The first and second sidewalls 100 and 200 may extend parallel to each other in the second horizontal direction (e.g., Y direction).

The first sidewall 100 may include a first support portion 110 having a first seating surface 112 for supporting the lower surface 21 of the semiconductor substrate 20, and a first fastening groove 120 configured to temporarily fasten the first side portion 20a of the semiconductor substrate 20.

The first support portion 110 may support the lower surface 21 of the semiconductor substrate 20 that is accommodated in the accommodating space S, through the first seating surface 112. The first support portion 110 may extend along the first sidewall 100 in the second horizontal direction (e.g., Y direction). The first support portion 110 may space the semiconductor substrate 20 apart from the base plate 30 through the first seating surface 112. For example, the first seating surface 112 may extend parallel to the base plate 30.

The first fastening groove 120 may be disposed on the first sidewall 100. The first fastening groove 120 may extend along the first sidewall 100 in the second horizontal direction (e.g., Y direction). The first fastening groove 120 may extend along the first seating surface 112 of the first support portion 110. When the semiconductor substrate 20 is placed on the first seating surface 112 of the first support portion 110, the first side portion 20a of the semiconductor substrate 20 may be inserted into and fastened to the first fastening groove 120.

The first fastening groove 120 may have a first shape (a predetermined shape). The first shape may have a shape corresponding to the first side portion 20a of the semiconductor substrate 20. The first fastening groove 120 may stably fix the first side portion 20a of the semiconductor substrate 20 through the first shape.

The second sidewall 200 may include a second support portion 210 having a second seating surface 212 for supporting the lower surface 21 of the semiconductor substrate 20, and a second fastening groove 220 configured to temporarily fasten the second side portion 20b of the semiconductor substrate 20. The first side portion 20a and the second side portion 20b of the semiconductor substrate 20 may be opposite to each other.

The second support portion 210 may support the lower surface 21 of the semiconductor substrate 20 that is accommodated in the accommodating space S, through the second seating surface 212. The second support portion 210 may extend along the second sidewall 200 in the second horizontal direction (e.g., Y direction). The second support portion 210 may space the semiconductor substrate 20 apart from the base plate 30 through the second seating surface 212. For example, the second seating surface 212 may extend parallel to the base plate 30.

The second seating surface 212 of the second support portion 210 may be disposed on the same plane as the first seating surface 112 of the first support portion 110. Since the first seating surface 112 and the second seating surface 212 are disposed on the same plane, the semiconductor substrate 20 may be disposed parallel to the ground within the accommodating space S.

The second fastening groove 220 may be disposed on the second sidewall 200. The second fastening groove 220 may extend along the second sidewall 200 in the second horizontal direction (e.g., Y direction). The second fastening groove 220 may extend along the second seating surface 212 of the second support portion 210. When the semiconductor substrate 20 is placed on the second seating surface 212 of the second support portion 210, the second side portion 20b of the semiconductor substrate 20 may be inserted into and fastened to the second fastening groove 220.

Accordingly, the semiconductor substrate 20 may be simultaneously fastened to the first and second fastening grooves 120 and 220. The first and second fastening grooves 120 and 220 may temporarily fix the first and second side portions (both side portions) 20a and 20b of the semiconductor substrate 20, and the first and second fastening grooves 120 and 220 may restrict movement of the semiconductor substrate 20 in the vertical direction (e.g., Z direction). When the semiconductor substrate 20 is fastened to the first and second fastening grooves 120 and 220, the semiconductor substrate 20 may be prevented from being separated from the accommodating space S.

Inner surfaces 122 and 222 of the first and second fastening grooves 120 and 220 may be spaced apart from each other by a first distance D1. The first distance D1 may be greater than a width of the semiconductor substrate 20. Since the first distance D1 is greater than the width of the semiconductor substrate 20, for example, a distance between the first and second side portions 20a and 20b, the first and second fastening grooves 120 and 220 may temporarily fix the semiconductor substrate 20. For example, the first distance D1 may be within a range of 20 mm to 25 mm.

The second fastening groove 220 may have a second shape. The second shape may have a shape corresponding to the second side portion 20b of the semiconductor substrate 20. The second fastening groove 220 may stably fix the second side portion 20b of the semiconductor substrate 20 through the second shape. The second shape of the second fastening groove 220 may be the same as the first shape of the first fastening groove 120. Alternatively, the second shape may be different from the first shape.

For example, the first and second shapes may include a semicircular cross-sectional shape, a square cross-sectional shape, a triangular cross-sectional shape, etc. The first and second side portions 20a and 20b of the semiconductor substrate 20 may have a fillet shape or a chamfer shape. The fillet shape may have a curved cross-sectional shape. The chamfer shape may have an inclined cross-sectional shape. The semiconductor substrate 20 may be easily fixed between the first and second fastening grooves 120 and 220 through the fillet shape or the chamfer shape. When an external force is applied to detach the semiconductor substrate 20 from the accommodating space S, the semiconductor substrate 20 may be easily separated from the first and second fastening grooves 120 and 220 through the fillet shape or the chamfer shape.

Each of the first and second fastening grooves 120 and 220 may have a first width W1 from the first and second seating surfaces 112 and 212, respectively. The first width W1 may be greater than a thickness of the semiconductor substrate 20. Since the first width W1 is greater than the thickness of the semiconductor substrate 20, the first and second fastening grooves 120 and 220 may temporarily fix the semiconductor substrate 20. For example, the first width W1 may be within a range of 0.5 mm to 1 mm.

Each of the first and second fastening grooves 120 and 220 may have a first depth DE1 from the first and second sidewalls 100 and 200, respectively. The first depth DE1 may be within a range that allows engagement or separation of the semiconductor substrate 20. For example, the first depth DE1 may be within a range of 0.2 mm to 0.6 mm.

The inner surfaces 122 and 222 of the first and second fastening grooves 120 and 220 may be inclined at a first angle θ1 with respect to the first and second seating surfaces 112 and 212, respectively. When the external force for separating the semiconductor substrate 20 from the accommodating space S is applied, the inner surfaces 122 and 222 of the first and second fastening grooves 120 and 220 may easily separate the semiconductor substrate 20 through the first angle θ1. For example, the first angle θ1 may be within a range of 60 degrees to 80 degrees.

The first and second sidewalls 100 and 200 may further include first and second gripping grooves 40 and 50. The first and second gripping grooves 40 and 50 may expose at least portions of the first and second side portions 20a and 20b of the semiconductor substrate 20, respectively. When the first and second sidewalls 100 and 200 include the first and second gripping grooves 40 and 50, the first and second fastening grooves 120 and 220 may be extended (e.g., discontinuously) by the first and second gripping grooves 40 and 50.

The external force for separating the semiconductor substrate 20 from the accommodating space S may be transmitted to the module tray from an operator, a robot, or the like. The external force may be transmitted to the at least portions of the first and second side portions 20a and 20b of the semiconductor substrate 20 that are exposed from the first and second gripping grooves 40 and 50. The semiconductor substrate 20 may be easily separated from the accommodating space S through the first and second gripping grooves 40 and 50.

In example embodiments of the present disclosure, the third and fourth sidewalls 300 and 400 may extend in the vertical direction (e.g., Z direction) on the base plate 30 to define the accommodating space S. The third and fourth sidewalls 300 and 400 may extend between the first and second sidewalls 100 and 200. The third and fourth sidewalls 300 and 400 may extend parallel to each other in the first horizontal direction (e.g., X direction). The third and fourth sidewalls 300 and 400 may be substantially the same as or similar to the first and second sidewalls 100 and 200.

The third sidewall 300 may include a third support portion 310 having a third seating surface for supporting the lower surface 21 of the semiconductor substrate 20, and a third fastening groove 320 configured to temporarily fasten a third side portion 20c of the semiconductor substrate 20.

The third support portion 310 may support the lower surface 21 of the semiconductor substrate 20 accommodated in the accommodating space S, through the third seating surface. The third support portion 310 may extend in the first horizontal direction (e.g., X direction) along the third sidewall 300.

The third fastening groove 320 may be disposed on the third sidewall 300. The third fastening groove 320 may extend in the first horizontal direction (e.g., X direction) along the third sidewall 300. The third fastening groove 320 may extend along the third seating surface of the third support portion 310. When the semiconductor substrate 20 is placed on the third seating surface of the third support portion 310, the third side portion 20c of the semiconductor substrate 20 may be inserted into and fastened to the third fastening groove 320. The third fastening groove 320 may have a third shape. The third shape may have a shape corresponding to the third side portion 20c of the semiconductor substrate 20.

The fourth sidewall 400 may include a fourth support portion 410 having a fourth seating surface for supporting the lower surface 21 of the semiconductor substrate 20, and a fourth fastening groove 420 configured to temporarily fasten a fourth side portion 20d of the semiconductor substrate 20.

The fourth support portion 410 may support the lower surface 21 of the semiconductor substrate 20 accommodated in the accommodating space S, through the fourth seating surface. The fourth support portion 410 may extend in the first horizontal direction (X direction) along the fourth sidewall 400. For example, the first to fourth seating surfaces may be disposed on the same plane. The first to fourth seating surfaces may stably support the lower surface 21 of the semiconductor substrate 20 on the same plane.

The fourth fastening groove 420 may be disposed on the fourth sidewall 400. The fourth fastening groove 420 may extend along the fourth sidewall 400 in the first horizontal direction (e.g., X direction). The fourth fastening groove 420 may extend along the fourth seating surface of the fourth support portion 410. When the semiconductor substrate 20 is placed on the fourth seating surface of the fourth support portion 410, the fourth side portion 20d of the semiconductor substrate 20 may be inserted and fastened into the fourth fastening groove 420. The fourth fastening groove 420 may have a fourth shape. The fourth shape may have a shape corresponding to the fourth side portion 20d of the semiconductor substrate 20.

Thus, the semiconductor substrate 20 may be simultaneously fastened to the first to fourth fastening grooves 120, 220, 320, and 420. The first to fourth fastening grooves 120, 220, 320, and 420 may temporarily fix the first to fourth side portions 20a, 20b, 20c, and 20d of the semiconductor substrate 20, and the first to fourth fastening grooves 120, 220, 320, and 420 may restrict the movement of the semiconductor substrate 20 in the vertical direction (e.g., Z direction).

For example, a first height H1 of the first to fourth sidewalls 100, 200, 300, and 400 may be within a range of 50 mm to 400 mm. A second distance D2 between the first sidewall 100 and the second sidewall 200 may be smaller than a third distance D3 between the third sidewall 300 and the fourth sidewall 400. The second distance D2 between the first sidewall 100 and the second sidewall 200 may be within a range of 20 mm to 25 mm. The third distance D3 between the third sidewall 300 and the fourth sidewall 400 may be within a range of 75 mm to 85 mm.

As described above, the semiconductor substrate 20 may be disposed on the first and second seating surfaces 112 and 212 of the first and second support portions 110 and 210 in the accommodating space S. Since the lower surface 21 of the semiconductor substrate 20 is supported on the first and second seating surface 112 and 212, the semiconductor substrate 20 may be stably disposed within the accommodating space S. When the semiconductor substrate 20 is supported on the first and second seating surface 112 and 212, the first and second fastening grooves 120 and 220 of the first and second sidewalls 100 and 200 may be engaged with both side portions 20a and 20b of the semiconductor substrate 20. Since the first and second fastening grooves 120 and 220 extend along the first and second seating surfaces 112 and 212, the semiconductor substrate 20 may be stably supported by the first and second fastening grooves 120 and 220 and the first and second seating surfaces 112 and 212, and separation from the accommodating space S may be prevented.

Further, the first and second fastening grooves 120 and 220 may have the first and second shapes that correspond to both side portions 20a and 20b of the semiconductor substrate 20, respectively. The first and second shapes may vary according to a type of the semiconductor substrate 20 to stably fix the semiconductor substrate 20. Since the first and second fastening grooves 120 and 220 have the first and second shape, the semiconductor substrate 20 may be more fixedly held within the accommodating space S, and the separation from the accommodating space S may be prevented.

Figure 8:
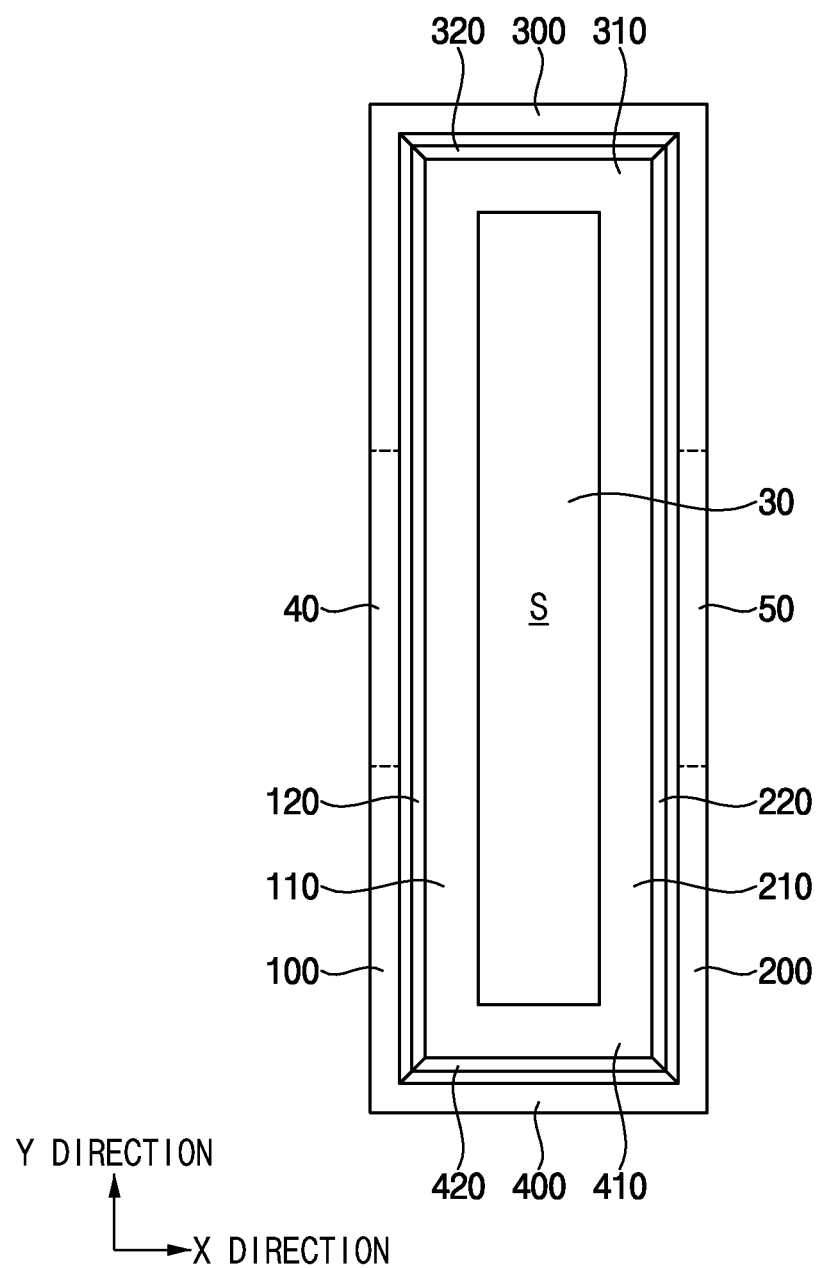
FIG. 8 is a plan view illustrating a module tray having first to fourth sidewalls for accommodating a semiconductor substrate with modified side portions in accordance with example embodiments of the present disclosure.
Figure 9:
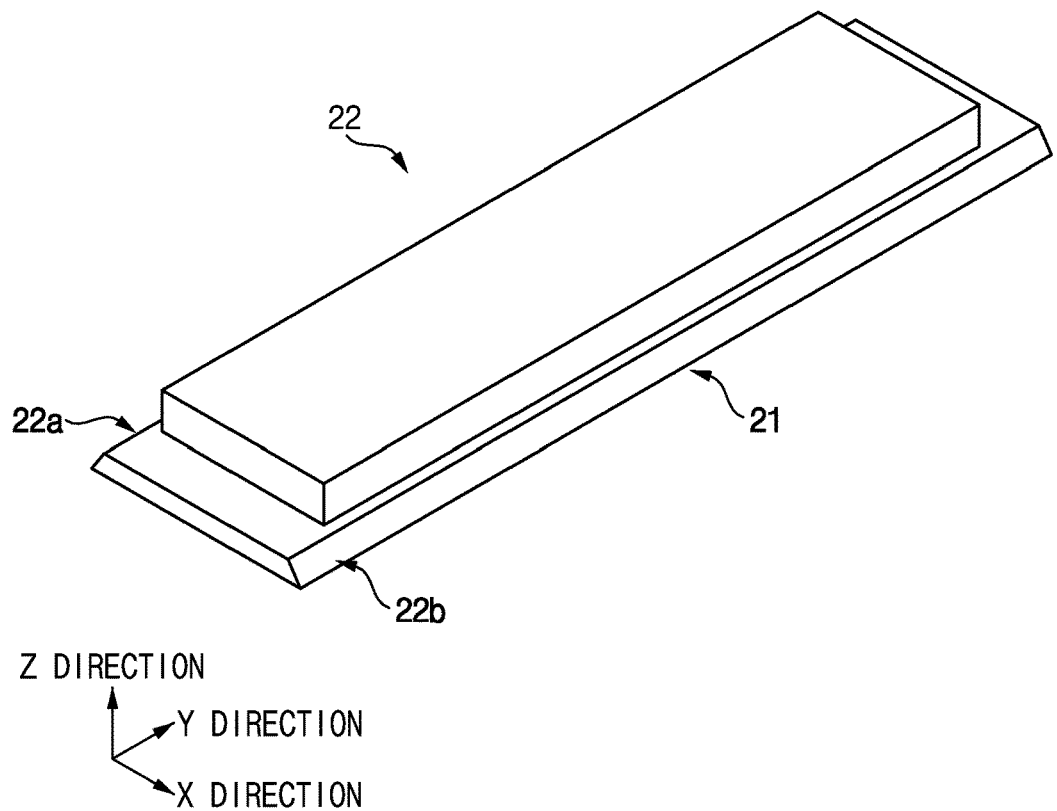
FIG. 9 is a perspective view illustrating a module tray having first to fourth sidewalls for accommodating a semiconductor substrate with modified side portions in accordance with example embodiments of the present disclosure.
Figure 10:
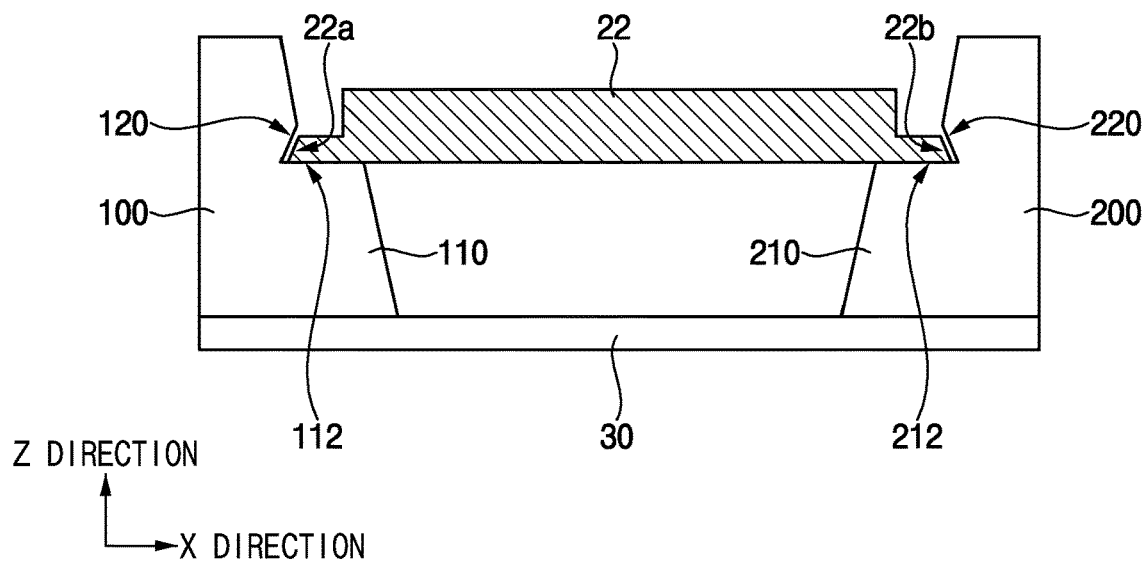
FIG. 10 is a cross-sectional view illustrating a module tray having first to fourth sidewalls for accommodating a semiconductor substrate with modified side portions in accordance with example embodiments of the present disclosure.

FIGS. 8 to 14 are views illustrating a module tray having first to fourth sidewalls for accommodating a semiconductor substrate with modified side portions in accordance with example embodiments of the present disclosure. FIG. 8 is a plan view illustrating a module tray having first to fourth sidewalls in accordance with example embodiments of the present disclosure. FIG. 9 is a perspective view illustrating the semiconductor substrate in accordance with example embodiments of the present disclosure. FIG. 10 is a cross-sectional view illustrating the semiconductor substrate in FIG. 9, wherein the semiconductor substrate is accommodated in the module tray. The module tray may be substantially the same as or similar to the module tray described with reference to FIGS. 1 to 7 except for configurations of first to fourth sidewalls. Thus, same or similar components may be denoted by the same or similar reference numerals, and to the extent that an element is not explained in detail, it may be understood that the element is at least similar to corresponding elements that have been described elsewhere within the present disclosure.

Referring to FIGS. 1, 2 and 8 to 10, a semiconductor substrate 22 may have a first side portion 22a and a second side portion 22b opposite to the first side portion 22a. The first and second side portions 22a and 22b of the semiconductor substrate 22 may have a triangular cross-sectional shape.

The first and second fastening grooves 120 and 220 may be disposed on the first and second sidewalls 100 and 200. When the semiconductor substrate 22 is placed on the first and second seating surfaces 112 and 212 of the first and second support portions 110 and 210, the first and second side portions 22a and 22b of the semiconductor substrate 22 may be inserted into and fastened to the first and second fastening grooves 120 and 220.

The first and second fastening grooves 120 and 220 may have first and second shapes, respectively. The module tray 10 may more strongly fix the semiconductor substrate 22 through the first and second shapes formed differently according to the type of the semiconductor substrate 22. The first and second shapes may have a triangular cross-sectional shape corresponding to the first and second side portions 22a and 22b of the semiconductor substrate 22.

When an external force for separating the semiconductor substrate 22 from the accommodating space S is applied, the first and second fastening grooves 120 and 220 may easily separate the semiconductor substrate 22 through the triangular cross-sectional shape. The first and second side portions 22a and 22b of the semiconductor substrate 22 may be slidably separated from the first and second fastening grooves 120 and 220 through the triangular cross-sectional shape.

Figure 11:
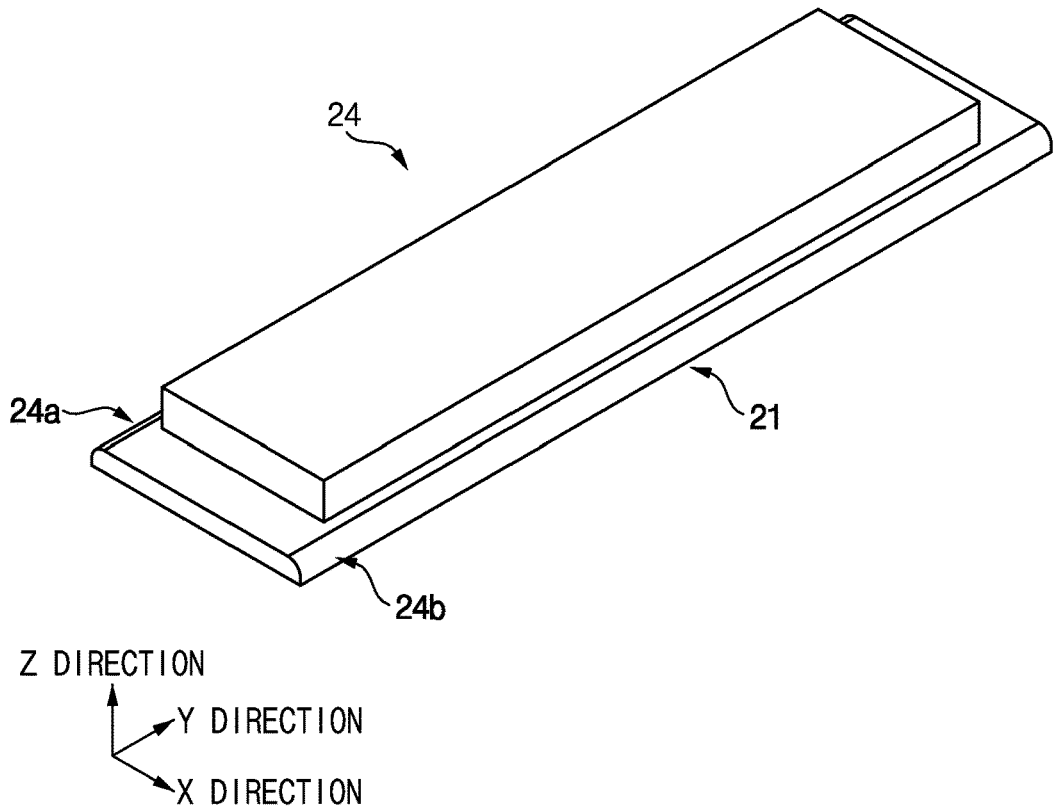
FIG. 11 is a perspective view illustrating a module tray having first to fourth sidewalls for accommodating a semiconductor substrate with modified side portions in accordance with example embodiments of the present disclosure.
Figure 12:
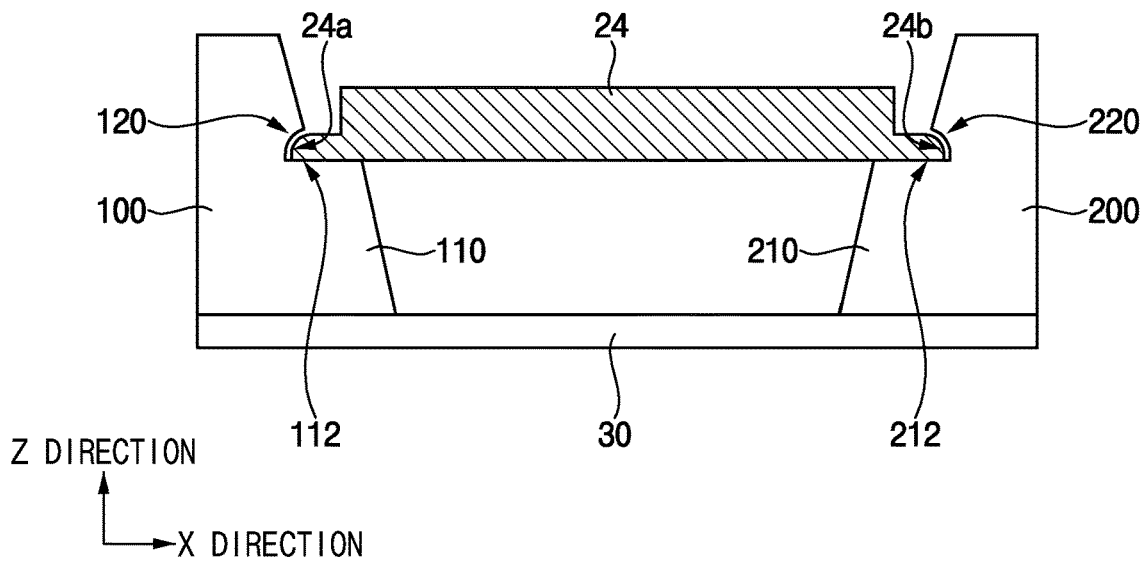
FIG. 12 is a cross-sectional view illustrating a module tray having first to fourth sidewalls for accommodating a semiconductor substrate with modified side portions in accordance with example embodiments of the present disclosure.

FIG. 11 is a perspective view illustrating a semiconductor substrate in accordance with example embodiments of the present disclosure. FIG. 12 is a cross-sectional view illustrating the semiconductor substrate in FIG. 11, wherein the semiconductor substrate is accommodated in a module tray.

Referring to FIGS. 1, 2, 8, 11, and 12, a semiconductor substrate 24 may have a first side portion 24a and a second side portion 24b opposite to the first side portion 24a. The first and second side portions 24a and 24b of the semiconductor substrate 24 may have a circular shape. The first and second side portions 24a and 24b of the semiconductor substrate 24 may have the fillet shape. The fillet shape may include a curvature.

The first and second shapes of the first and second fastening grooves 120 and 220 may have the circular shape or the fillet shape corresponding to the first and second side portions 24a and 24b of the semiconductor substrate 24.

When the external force for separating the semiconductor substrate 26 from the accommodating space S is applied, the first and second fastening grooves 120 and 220 may easily separate the semiconductor substrate 24 through the circular shape or the fillet shape. The first and second side portions 24a and 24b of the semiconductor substrate 24 may be slidably separated from the first and second fastening grooves 120 and 220 through the circular shape or the fillet shape.

Figure 13:
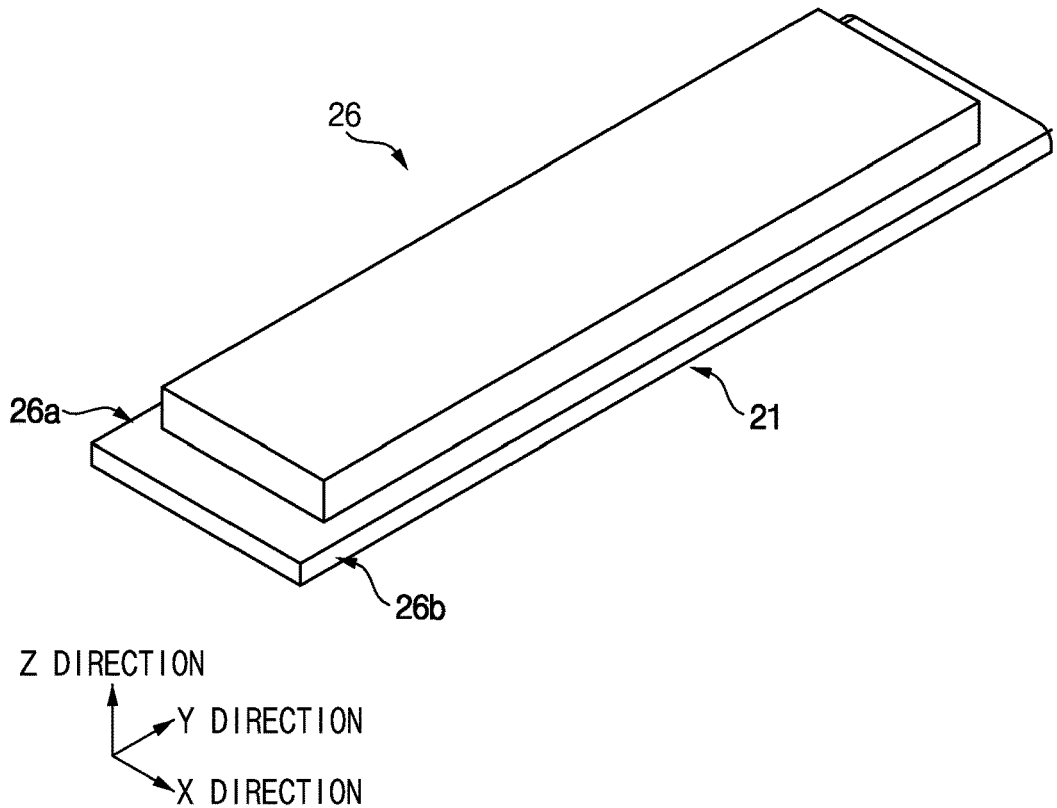
FIG. 13 is a perspective view illustrating a module tray having first to fourth sidewalls for accommodating a semiconductor substrate with modified side portions in accordance with example embodiments of the present disclosure.
Figure 14:
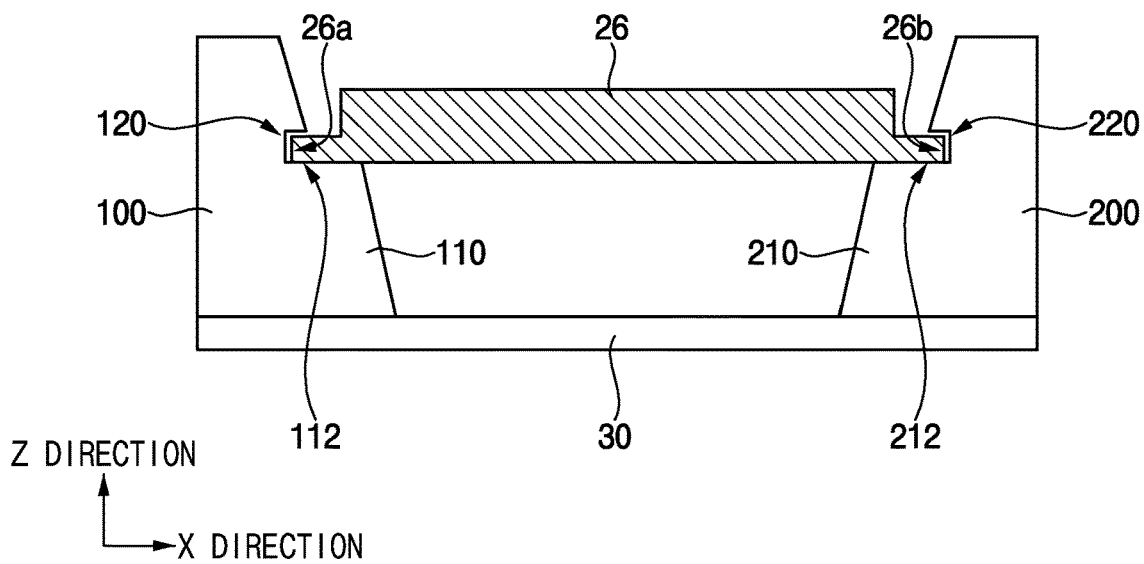
FIG. 14 is a cross-sectional view illustrating a module tray having first to fourth sidewalls for accommodating a semiconductor substrate with modified side portions in accordance with example embodiments of the present disclosure.

FIG. 13 is a perspective view illustrating a semiconductor substrate in accordance with example embodiments of the present disclosure. FIG. 14 is a cross-sectional view illustrating the semiconductor substrate in FIG. 13 that is accommodated in a module tray.

Referring to FIGS. 1, 2, 8, 13 and 14, a semiconductor substrate 26 may have a first side portion 26a and a second side portion 26b opposite to the first side portion 26a. The first and second side portions 26a and 26b of the semiconductor substrate 26 may have a quadrilateral cross-sectional shape.

The first and second shapes of the first and second fastening grooves 120 and 220 may have the quadrilateral cross-sectional shape corresponding to the first and second side portions 26a and 26b of the semiconductor substrate 26. When an impact is applied to the module tray 10 in which the semiconductor substrate 26 is accommodated, the first and second fastening grooves 120 and 220 may strongly fix the first and second side portions 26a and 26b of the semiconductor substrate 26 through the rectangular cross-sectional shape.

The foregoing is illustrative of example embodiments of the present disclosure and is not necessarily to be construed as limiting thereof. Although a few example embodiments of the present disclosure have been described, those skilled in the art will readily appreciate that many modifications are possible in example embodiments of the present disclosure without materially departing from the novel teachings and aspects of the present disclosure. Accordingly, all such modifications are intended to be included within the scope of example embodiments of the present disclosure.

What is claimed is:

1. A module tray for a semiconductor device, comprising:
a base plate; and
first and second sidewalls extending in a vertical direction from the base plate and defining an accommodating space in which a semiconductor substrate is accommodated,
wherein the first and second sidewalls include first and second support portions and first and second fastening grooves respectively,
wherein the first and second support portions have seating surfaces for supporting a lower surface of the semiconductor substrate in the accommodating space, and
wherein the first and second fastening grooves respectively extend along the seating surfaces and are configured to temporarily fix the semiconductor substrate within the module tray, wherein an inner surface of each of the first and second fastening grooves is inclined at a predetermined angle with respect to each of the seating surfaces, and the predetermined angle is within a range of from 60 degrees to 80 degrees.

2. The module tray of claim 1, further comprising:
third and fourth sidewalls extending in the vertical direction from the base plate between the first and second sidewalls, the third and fourth sidewalls including third and fourth fastening grooves that respectively extend along the seating surfaces for temporarily fixing the semiconductor substrate.

3. The module tray of claim 1, wherein a distance between inner surfaces of the first and second fastening grooves is within a range of from 20 mm to 25 mm.

4. The module tray of claim 1, wherein each of the first and second fastening grooves has a predetermined width from each of the seating surfaces, and the predetermined width is within a range of from 0.5 mm to 1 mm.

5. The module tray of claim 1, wherein each of the first and second fastening grooves has a predetermined depth from each of the first and second sidewalls, and the predetermined depth is within a range of from 0.2 mm to 0.6 mm.

6. The module tray of claim 1, wherein the first and second fastening grooves have a semicircular cross-sectional shape, a square cross-sectional shape, or a triangular cross-sectional shape.

7. The module tray of claim 1, wherein each of two side portions of the semiconductor substrate have a fillet shape and/or a chamfer shape.

8. The module tray of claim 1, wherein the first and second sidewalls further include first and second gripping grooves that expose at least portions of two side portions of the semiconductor substrate.

9. The module tray of claim 1, wherein the semiconductor substrate includes a solid-state storage drives (SSD).

10. A module tray for a semiconductor device, comprising:
a base plate; and
first and second sidewalls extending in a vertical direction from the base plate and defining an accommodating space in which a semiconductor substrate is accommodated,
wherein the first and second sidewalls include:
first and second support portions having first and second seating surfaces for supporting a lower surface of the semiconductor substrate; and
first and second fastening grooves respectively extending along the first and second seating surfaces,
wherein the first and second fastening grooves respectively have first and second shapes that correspond to first and second side portions of the semiconductor substrate, and
wherein the first and second fastening grooves are configured to engage to or separate from the first and second side portions of the semiconductor substrate through the first and second shapes,
wherein an inner surface of each of the first and second fastening grooves is inclined at a predetermined angle from each of the first and second seating surfaces, and the predetermined angle is within a range of from 60 degrees to 80 degrees.

11. The module tray of claim 10, further comprising:
third and fourth sidewalls extending in the vertical direction from the base plate between the first and second sidewalls, the third and fourth sidewalls including third and fourth fastening grooves that respectively extend along the first and second seating surfaces for temporarily fixing the semiconductor substrate.

12. The module tray of claim 10, wherein a distance between inner surfaces of the first and second fastening grooves is within a range of from 20 mm to 25 mm.

13. The module tray of claim 10, wherein each of the first and second fastening grooves has a predetermined width from each of the first and second seating surfaces, and the predetermined width is within a range of from 0.5 mm to 1 mm.

14. The module tray of claim 10, wherein each of the first and second fastening grooves has a predetermined depth from each of the first and second sidewalls, and the predetermined depth is within a range of from 0.2 mm to 0.6 mm.

15. The module tray of claim 10, wherein the first and second shapes include a semicircular cross-sectional shape, a square cross-sectional shape, and/or a triangular cross-sectional shape.

16. The module tray of claim 10, wherein each of the first and second side portions of the semiconductor substrate have a fillet shape or a chamfer shape.

17. The module tray of claim 10, wherein the first and second sidewalls further include first and second gripping grooves that expose at least portions of the first and second side portions of the semiconductor substrate.

18. A module tray for a semiconductor device, comprising:
a base plate;
first and second sidewalls extending in a vertical direction from the base plate and defining an accommodating space in which a semiconductor substrate is accommodated; and
third and fourth sidewalls extending in the vertical direction from the base plate between the first and second sidewalls,
wherein the first and second sidewalls include:
first and second support portions having first and second seating surfaces for supporting a lower surface of the semiconductor substrate; and
first and second fastening grooves respectively extending along the first and second seating surfaces,
wherein the first and second fastening grooves respectively have first and second shapes that correspond to first and second side portions of the semiconductor substrate,
wherein the first and second fastening grooves are configured to engage to or separate from the first and second side portions of the semiconductor substrate through the first and second shapes, wherein an inner surface of each of the first and second fastening grooves is inclined at a predetermined angle from each of the first and second seating surfaces, and the predetermined angle is within a range of from 60 degrees to 80 degrees, wherein the third and fourth sidewalls include:
- third and fourth support portions having third and fourth seating surfaces disposed on a same plane as the first and second seating surfaces; and
- third and fourth fastening grooves respectively extending along the third and fourth seating surfaces, wherein the third and fourth fastening grooves respectively have third and fourth shapes that correspond to third and fourth side portions of the semiconductor substrate, and wherein the third and fourth fastening grooves are configured to engage to or separate from the third and fourth side portions of the semiconductor substrate through the third and fourth shapes.

* * * * *